United States Patent [19]

Tsuchida et al.

[11] Patent Number: 5,585,731
[45] Date of Patent: Dec. 17, 1996

[54] TEST CIRCUIT OF CURRENT-VOLTAGE CONVERSION AMPLIFIER

[75] Inventors: Kazuhito Tsuchida; Koji Kashimoto, both of Hyogo, Japan

[73] Assignee: Mitsubishi Denki Kabushiki Kaisha, Tokyo, Japan

[21] Appl. No.: 428,346

[22] Filed: Apr. 25, 1995

[30] Foreign Application Priority Data

Nov. 1, 1994 [JP] Japan .................................. 6-268926

[51] Int. Cl.$^6$ .................................................. G01R 31/02
[52] U.S. Cl. .......................................... 324/537; 324/549
[58] Field of Search .................................... 324/537, 548, 324/549; 369/44.25; 204/403

[56] References Cited

U.S. PATENT DOCUMENTS

5,320,732  6/1994  Nankai et al. ...................... 204/403
5,425,011  6/1995  Kusano et al. ...................... 369/44.25

Primary Examiner—Michael Tokar
Attorney, Agent, or Firm—Oblon, Spivak, McClelland, Maier & Neustadt, P.C.

[57] ABSTRACT

A test circuit for testing a current-voltage conversion amplifier having photodiode (PD) without actually exposing light to PD, including a current mirror circuit having a first NPN transistor and a second NPN transistor, an input terminal for applying a test voltage, a resistor connected between the input terminal and a collector of the first NPN transistor, and a current terminal connected to a collector of the second NPN transistor. The test circuit passes a current from the current-voltage conversion amplifier to the current terminal according to the test voltage which is applied to the input terminal.

14 Claims, 6 Drawing Sheets

TEST CIRCUIT OF CURRENT-VOLTAGE CONVERSION AMPLIFIER

BACKGROUND OF THE INVENTION

1. Field of the invention

The invention relates to a circuit for testing current-voltage conversion amplifier for photodiode (PD), which is referred to as PD in the following.

2. Description of the Prior Art

It is a primary object of the present invention to provide a circuit for testing a current-voltage conversion amplifier having PD without actually exposing light to PD.

Figure 10:
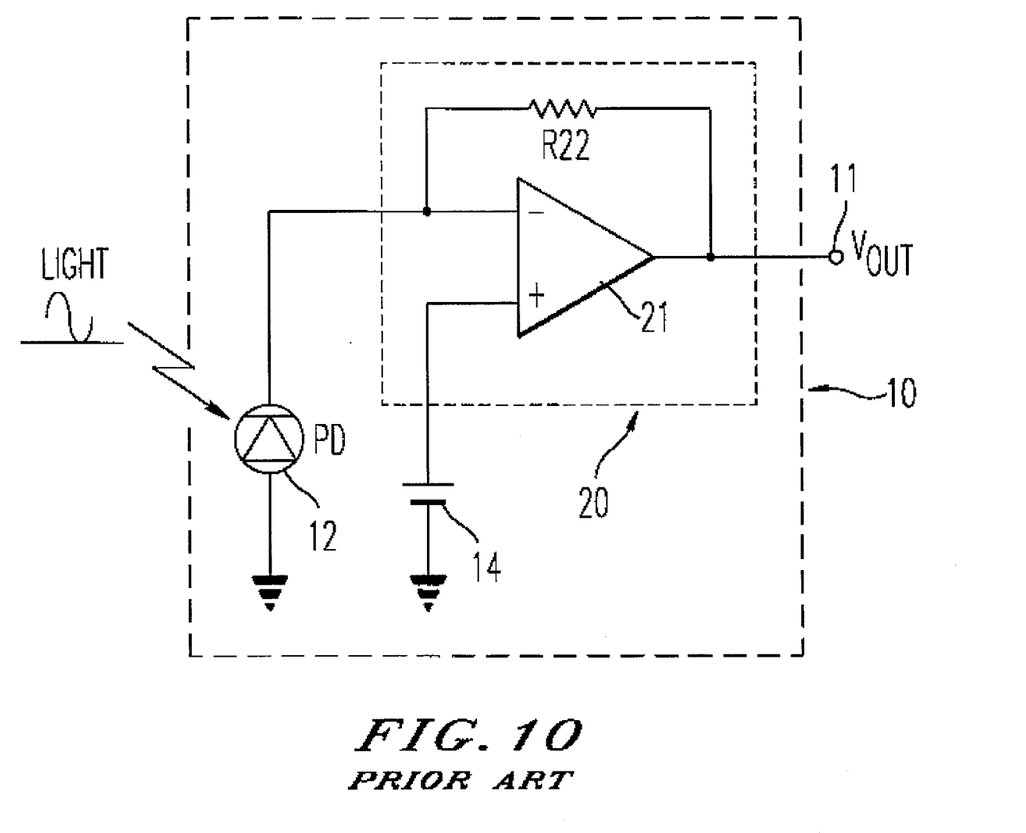
FIG. 10 illustrates a conventional circuit for testing the current-voltage conversion amplifier.

FIG. 10 shows a current-voltage conversion amplifier having a PD which are incorporated onto IC. In FIG. 10, the numeral 10 denotes a light sensor, the numeral 12 denotes a PD, 20 denotes a current-voltage conversion amplifier, the numeral 14 denotes a reference supply, the numeral 21 denotes an amplifier, the numeral 22 denotes a feedback resistor. When PD is exposed to the light PD pulls current I from current-voltage conversion amplifier 20 in the light sensor circuit 10. Then the current I is convened into a voltage V at the current-voltage conversion amplifier so that the outputs voltage (Vout) is outputted to an output terminal 11 in proportion to the strength of the light.

In case that PD 12 is a type for pulling current from inverted terminal of amplifier 21 when PD is exposed to the light, the current-voltage conversion amplifier 20 operates so that an output voltage of the output terminal 11 increases in response to the increase of the light intensity.

On the other hand, in case that PD is a type for pouting current into an inverted terminal of the amplifier 21 when IC is exposed to light, the current-voltage conversion amplifier 20 operates so that an output voltage (Vout) of the output terminal 11 decreases as light intensity increases.

Conventionally, characteristics of PD incorporated onto IC is measured by actually exposing light to PD and obtaining an output voltage from the current-voltage conversion amplifier after IC is assembled.

However, when carrying out the test by actually exposing the light to PD, the test equipment for illuminating the light is expensive and complex. Furthermore, it takes a long time for testing, and personnel expenses become high, accordingly there is a problem that a cost of semi-conductor becomes high.

SUMMARY OF THE INVENTION

The invention relates to a test circuit for testing a current-voltage conversion amplifier which solves the above problems.

In the present invention, it is possible to test the current-voltage conversion amplifier in the same way which actually exposes a light to PD without actually exposing light to PDs on the semi-conductor substrate. In the present invention, a voltage is only applied to a test terminal arranged on the semi-conductor substrate. Therefore, it is possible to complete the test simply and shorten the test time. Accordingly, since it is also possible to supply cheap IC and cheap semiconductor IC, economical effects are significantly large.

According to one aspect of the present invention, a test circuit for testing a current-voltage conversion amplifier comprises a current mirror circuit comprised of a first NPN transistor and a second NPN transistor; an input terminal for applying a test voltage; a first resistor connected between said input terminal and a collector of the first NPN transistor; and a current terminal connected to a collector of the second NPN transistor, wherein said test circuit pulls a current from the current-voltage conversion amplifier to said current terminal according to the test voltage which is applied to said input terminal.

According to another aspect of the invention, a test circuit for testing a current-voltage conversion amplifier comprises a current mirror circuit comprised of a first PNP transistor and a second PNP transistor; an input terminal for applying a test voltage; a first resistor connected between said input terminal and an emitter of the first PNP transistor; and a current terminal connected to an emitter of the second PNP transistor, wherein said test circuit pours a current from said current terminal to the current-voltage conversion amplifier according to the test voltage which is applied to said input terminal.

According to further aspect of the invention, a test circuit for testing a current-voltage conversion amplifier comprises a current mirror circuit comprised of n NPN transistors; an input terminal for applying a test voltage; a first resistor connected between said input terminal and a collector of the first NPN transistor; and a plurality of current terminals connected to collectors of wherein said n–1 NPN transistors, respectively; said test circuit pulls respective currents from the plurality of current-voltage conversion amplifiers to said current terminals according to the test voltage which is applied to said input terminal.

According to further aspect of the invention, a test circuit having n NPN transistors further comprises an another NPN transistor; whose base is connected to the collector of the first NPN transistor, whose emitter is connected to the base of the first NPN transistor, and whose collector is connected to a direct power supply.

According to further aspect of the invention, a test circuit for testing a current-voltage conversion amplifier comprises a first current mirror circuit comprising of a first and a second NPN transistors; a second current mirror circuit comprising of a third and a fourth NPN transistors;an input terminal for applying a test voltage; a first resister connected between the input terminal and collectors of the first and fourth NPN transistors; a current terminal connected to a collector of the second NPN transistor; a current supplying circuit connected to a collector of the third NPN transistor; wherein said test circuit pulls a current from the current-voltage conversion amplifier to said current terminal according to the test voltage which is applied to said input terminal.

According to further aspect of the invention, a test circuit for testing a current-voltage conversion amplifier comprises a first current mirror circuit comprising a first and a second NPN transistor; a second current mirror circuit comprising a third and a fourth PNP transistor; an input terminal for applying a test voltage; a first resistor connected between said input terminal and a collector of the first NPN transistor; a current terminal connected to a collector of the second NPN transistor and a collector of the fourth PNP transistor; and a second resistor connected between a collector of the third PNP transistor and the earth; wherein said test circuit pulls a current from the current-voltage conversion amplifier to said current terminal according to the test voltage which is applied to said input terminal.

According to further aspect of the invention, the test circuit further comprises a pull-down resister connected between said input terminal and ground for decreasing noise.

DETAILED DESCRIPTION OF THE PREFERRED EMBODIMENTS

Embodiment 1

Figure 1:
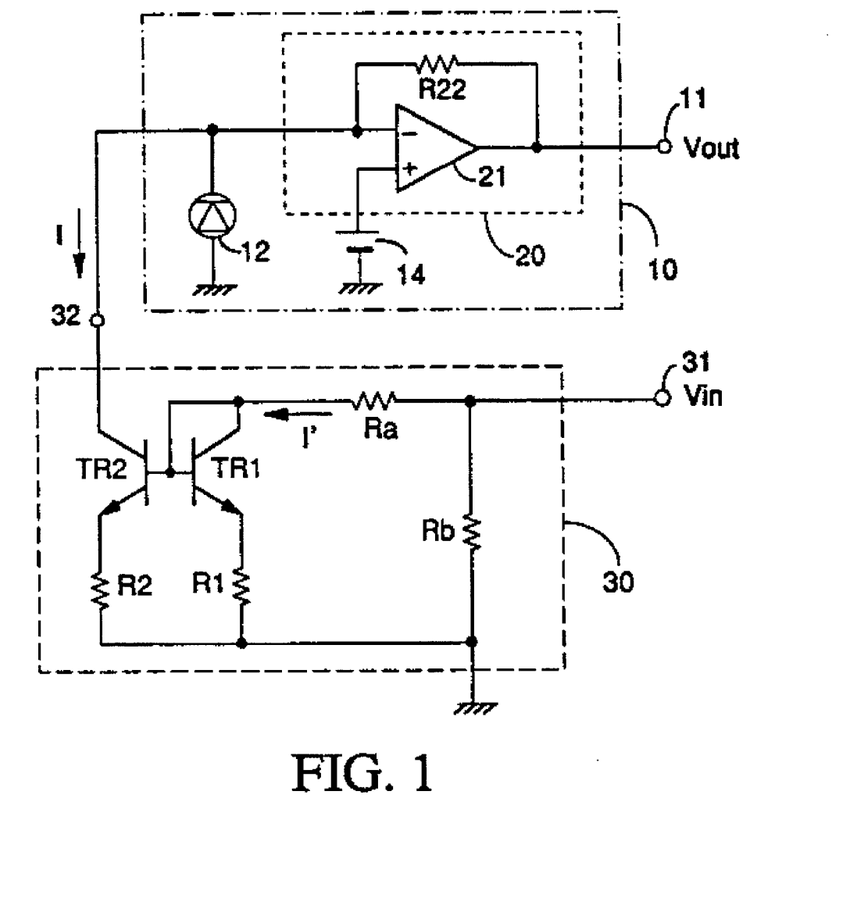
FIG. 1 illustrates a testing circuit for a current-voltage conversion amplifier of a first embodiment of the present invention.

FIG. 1 illustrates a test circuit for testing a current-voltage conversion amplifier of an first embodiment of the present invention. In FIG. 1, the numeral 10 denotes a light sensor formed on the IC, the numeral 12 denotes a PD, the numeral 20 denotes a current-voltage conversion amplifier, the numeral 21 denotes an amplifier, $R_{22}$ denotes a resister, the numeral 14 denotes reference supply, and the numeral 11 denotes an output terminal. When PD 12 on IC is exposed to the light, PD 12 pulls the current generated by the light exposure from the inverted terminal of amplifier 21. The amplifier 21 supplies an output voltage, which is generated according to the amplification factor decided by resistor $R_{22}$ and a reference voltage 14, to the output terminal 11.

The numeral 30 denotes a test circuit for testing the current-voltage conversion amplifier of the present invention. The test circuit of the current-voltage conversion amplifier of the first embodiment is used for testing PDs in case of the type of pulling current. $TR_1$ and $TR_2$ are NPN transistors, and $R_1$, $R_2$, Ra, Rb are resistors. The numeral 31 denotes a test terminal for applying test voltage. NPN transistors $TR_1$, $TR_2$ and resistors $R_1$, $R_2$ constitute a current mirror. Resistor Ra limits a current of current mirror.

The resistor Rb functions as a noise pull-down resistor, which bypasses the noise voltage to the earth in order not to supply the current from the current terminal of testing circuit 30 for testing the current-voltage conversion amplifier 20 to the light sensor 10, if noise voltage is induced at the test terminal 31 by some reasons after IC was released in a market.

The operation of test circuit 30 for testing the current-voltage conversion amplifier 20 of an embodiment of the present invention is explained in the following. In this invention, a test which is carried out by directly exposing light to PD can be similarly achieved without directly exposing the light to PD. Accordingly, since the light is not actually exposed to PD, a light current does not flow in PD.

FIG. 2 shows a relationship between test voltage (Vin) applied to the test terminal 31, currents I and I' flowing in the current mirror circuit, and an output voltage (Vout) outputted to the output terminal 11 of the light sensor 10. FIG. 2 shows a case where the current I equals to the current I'.

Figure 2A:
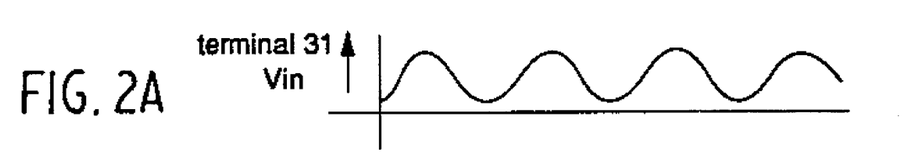
FIG. 2 shows a relationship between a test voltage Vin applied at the test terminal, a current I flowing in the current mirror circuit, and an output voltage Vout of the output terminal of the light sensor.
Figure 2B:
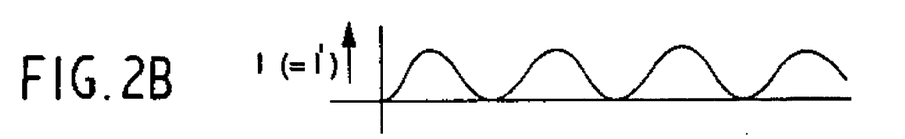

When applying a voltage signal Vin shown in FIG. 2(a) to the test terminal 31, a current signal I', shown in FIG. 2(b), which is decided by the resistor Ra, NPN transistor $TR_1$ and the resistor $TR_1$, flows in the collector of NPN transistor $TR_1$. This current I' is converted into current I via the current mirror constituted of NPN transistors $TR_1$, $TR_2$ and resistors $R_1$, $R_2$, and pulls current from the current-voltage conversion amplifier 20 into the terminal 32.

Various kinds of relationships between current I and current I' can be achieved such as I=I', I>I' and I<I' by varying emitter sizes of $TR_1$ and $TR_2$, and the resistance value of the resistors $R_1$, $R_2$. FIG. 2 shows a case where the current I equals to the current I'.

Figure 2C:
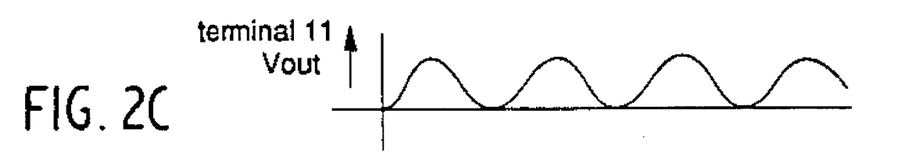

By pulling current from the current-voltage conversion amplifier 20, the current-voltage conversion amplifier 20 operates to output a voltage Vout, which is corresponding to test voltage Vin, at the output terminal 11 of the light sensor 10 as shown in FIG. 2(c). Since a current pulling type PD is used in FIG. 1, the voltage Vout becomes larger as the pulled current I becomes larger. Accordingly, Vin and Vout become in-phase as is shown in FIG. 2. As explained above, by merely applying test signal Vin to the test terminal 31, a test circuit 30 for testing the current-voltage conversion amplifier 20 can be carried out without actually exposing PD to the light.

Embodiment 2

Figure 3:
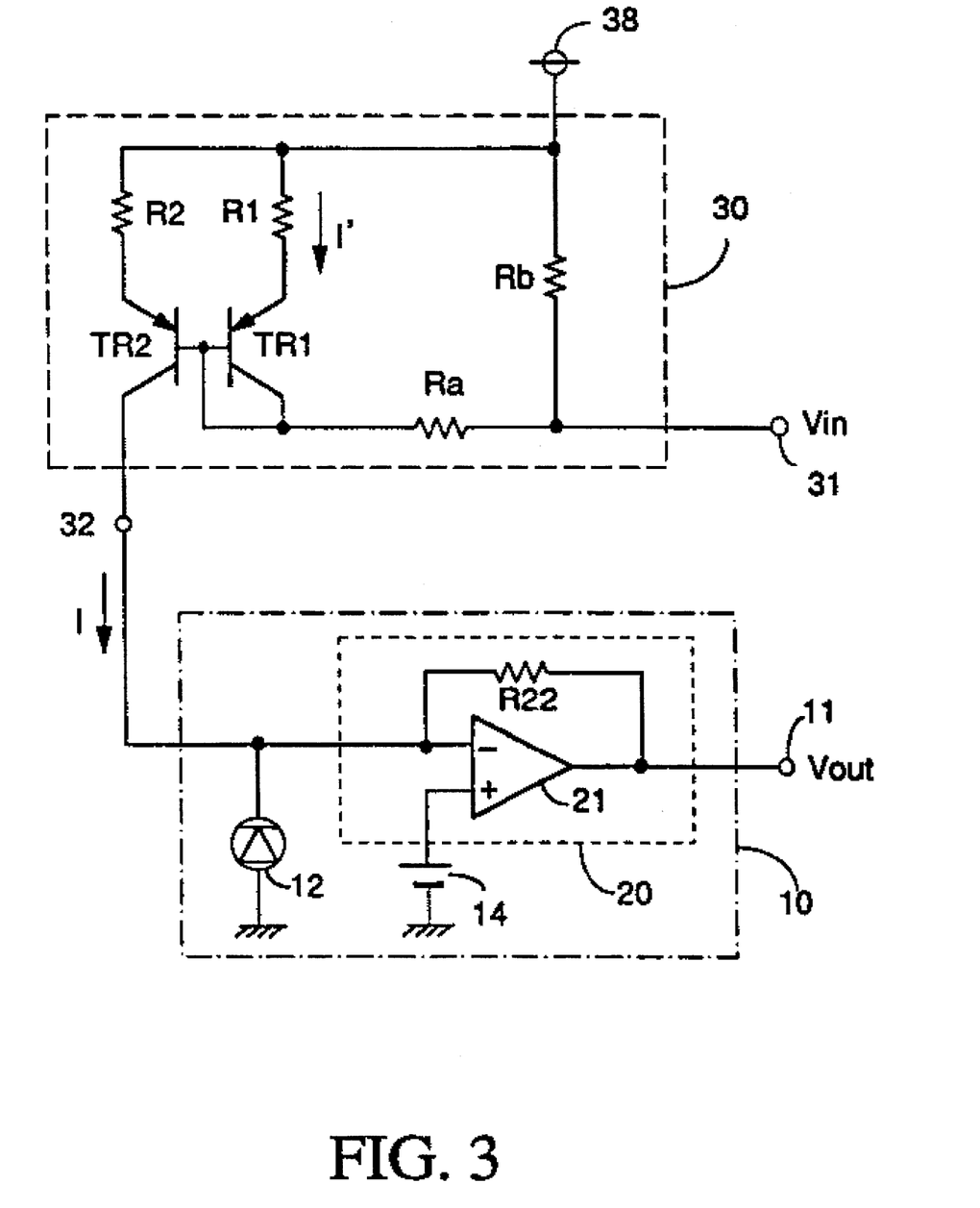
FIG. 3 illustrates a circuit for testing the current-voltage conversion amplifier of a second embodiment of the present invention.

FIG. 3 illustrates a test circuit for testing the current-voltage conversion amplifier 20 of a second embodiment of the present invention. Embodiment 2 is provided for testing current pouring type PD. In FIG. 3, $TR_1$, $TR_2$ are PNP transistors, $R_1$, $R_2$, Ra, Rb are resisters, and the numeral 38 denotes a power supply. PNP transistors $TR_1$, $TR_2$, resistors $R_1$, $R_2$ constitute a current mirror. Resistors Ra and Rb operate in the same way as described in the first embodiment.

An operation of the second embodiment is explained below. When voltage signal Vin is applied to the test terminal 11, the voltage Vin is convened into a current I', by resistor Ra, $R_1$ and transistor $TR_1$, which flows in the collector of PNP transistor $TR_1$. This current I' is convened into current I by a current mirror, which is constituted of PNP transistors $TR_1$, $TR_2$ and resistors $R_1$, $R_2$, to pour a current I into the test circuit 30 via the current terminal 32.

This circuit operates in the same way as that of FIG. 1 although the direction of the current I is different from that of FIG. 1. As explained above, a test for the current-voltage conversion amplifier having PD of current pouring type can be carded out by applying input voltage Vin, in the same way as in the first embodiment, to test terminal 31 without exposing it to light.

Embodiment 3

Figure 4:
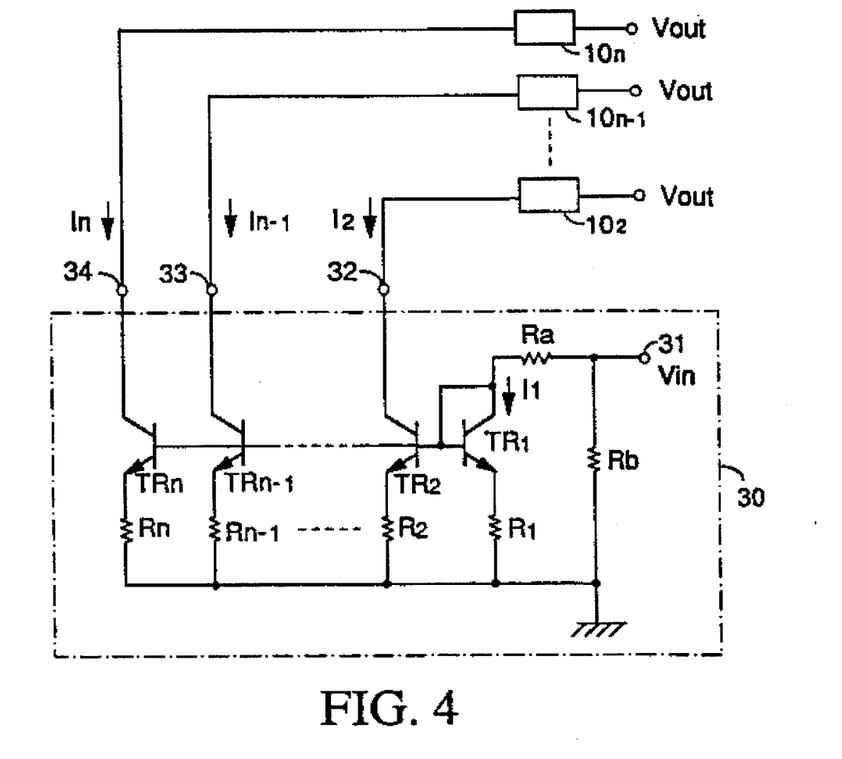
FIG. 4 illustrates a circuit for testing the current-voltage conversion amplifier of a third embodiment of the present invention.

FIG. 4 illustrates a test circuit 30 for testing the current-voltage conversion amplifier 20 of the third embodiment of the present invention. In FIG. 4, $TR_1 \sim TR_n$ are NPN transistors, $R_1 \sim R_n$, Ra, Rb are resistors. The numerals 32, 33 and 34 are current terminals for respectively pulling current from plural light sensors $10_2$, $10_{n-1}$ and 10n. A plurality of PDs, e.g. PD used for signal, PD used for detecting location, are usually provided on a single IC substrate. When testing the current-voltage conversion amplifier 20 having a plurality of PDs at a time, a test circuit 30 shown in FIG. 4 is used.

An operation of the fourth embodiment is explained below. When a test voltage Vin is applied to the test terminal 31, a current $I_1$, which is decided by resistor Ra, NPN transistor $TR_1$ and resistor $R_1$, flows into the collector of NPN transistor $TR_1$. This current $I_1$ is converted into current $I_2 \sim I_n$ at the respective NPN transistors $TR_2 \sim TR_n$ which are parts of the current mirrors constituted by NPN transistors $TR_1 \sim TR_n$ and resistors $R_1 \sim R_n$. Each current mirror pulls current from each n−1 current-voltage conversion amplifiers 20. As mentioned above, the current-voltage conversion amplifier having a plurality of current pouring type PDs can be tested at a time in the third embodiment as well, by applying the test signal Vin to the test terminal 31 without exposing light to PDs in the same way as explained in the first embodiment.

Embodiment 4

Figure 5:
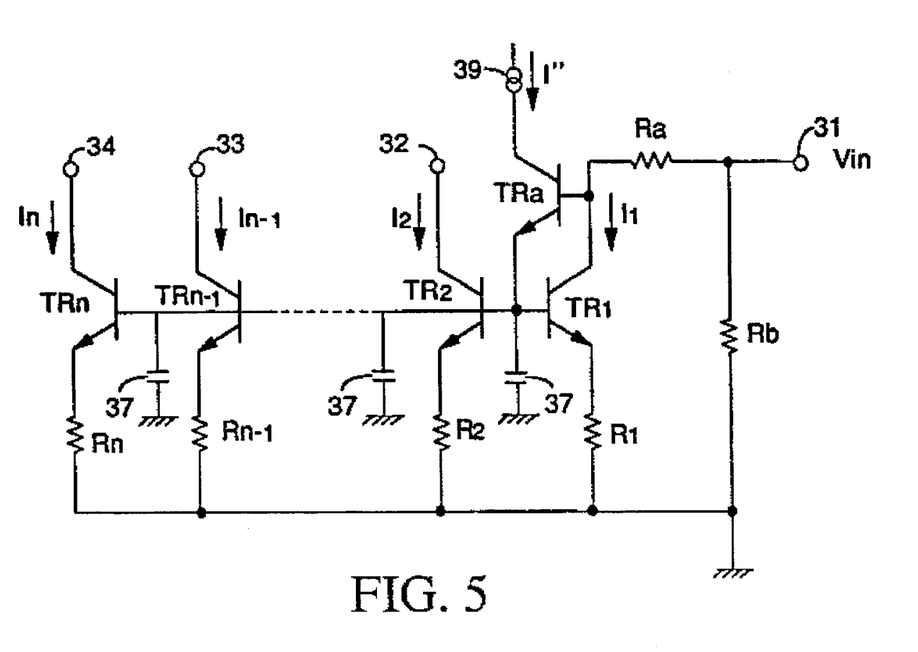
FIG. 5 illustrates a circuit for testing the current-voltage conversion amplifier of a fourth embodiment of the present invention.

FIG. 5 illustrates a test circuit 30 for testing the current-voltage conversion amplifier 20 of the fourth embodiment of the present invention. In FIG. 5, $TR_1 \sim TR_n$ are NPN transistors and $R_1 \sim R_n$, Ra and Rb are resistors. TRa is a transistor for charging the base parasitic capacitance of $TR_1 \sim TR_n$, and used for accelerating the operation of transistors. The numeral 39 denotes a current source which supplies current I" to TRa. The numerals 32 –34 denote current terminals connected to a plurality of the current-voltage conversion amplifiers 20 for pulling the currents in the same way as shown in FIG. 4. The numeral 37 denotes a base parasitic capacitance of the transistor.

An operation of the fourth embodiment is explained below. When a voltage signal is applied to the test terminal, a current $I_1$, which is decided by resistor Ra, NPN transistor $TR_1$ and resistor $R_1$, flows into the collector of NPN transistor $TR_1$. This current $I_1$ is converted into current $I_2 \sim I_n$ at the respective NPN transistors $TR_2 \sim TR_n$ which are parts of the current mirrors constituted by NPN transistors $TR_1 \sim TR_n$ and resistors $R_1 \sim R_n$. Each current mirror pulls current from each n−1 current-voltage conversion amplifier 20.

The base parasitic capacitances 37 of NPN transistors of $TR_1 \sim TR_n$ are charged by the current supplied by NPN transistor TRa. NPN transistors of $TR_1 \sim TR_n$ do not operate until the charges are completed. Accordingly, the operation of transistors becomes slow as is well known. Therefore, in this embodiment, a transistor TRa is provided for charging the base parasitic capacitances of $TR_1 \sim TR_n$ by current I" which is independent from the current $I_1$ and supplied through the current source 39. As a result, the operation of the transistors can be accelerated in comparison with the third embodiment. As mentioned above, the current-voltage conversion amplifier 20 having a plurality of current pouring type PDs can be tested in a high-speed, by applying the test signal Vin to the test terminal 31 without exposing light to PDs in the same way.

Embodiment 5

Figure 6:
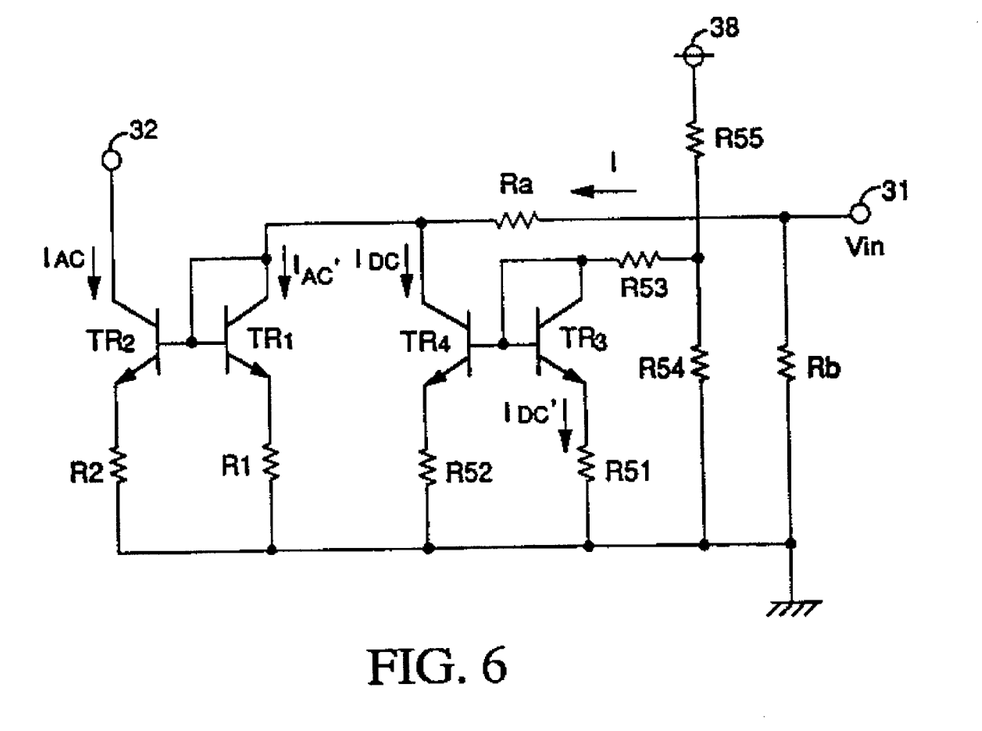
FIG. 6 illustrates a circuit for testing the current-voltage conversion amplifier of a fifth embodiment of the present invention.

FIG. 6 is a circuit diagram of a test circuit 30 for testing the current-voltage conversion amplifier 20 of a fifth embodiment of the present invention. In FIG. 6, $TR_1 \sim TR_4$ are NPN transistors and $R_1$, $R_2$, $R_{51}$, $R_{52}$, Ra, Rb are resistors. NPN transistors $TR_1$, $TR_2$ and resistors $R_1$, $R_2$ constitute a first current mirror. NPN transistors $TR_3$, $TR_4$ and resistors $R_{51}$, $R_{52}$ constitute a second current mirror. The numeral 38 denotes a current power supply, $R_{53}$, $R_{54}$, $R_{55}$ are resistors, and $R_{54}$ and $R_{55}$ constitute potential dividers. FIG. 7 shows a relationship between the current I provided from the test terminal 31, the current $I_{DC}$ flowing into the second current mirror circuit and respective currents $I_{AC}'$ and $I_{AC}$ flowing into the first current mirror circuit.

An operation of the fifth embodiment is explained below. In the test circuit of FIG. 6, an alternating current $I_{AC}'$ shown in FIG. 7(b), which is decided by resistor Ra, NPN transistor $TR_1$ and resistor $R_1$, flows into the first transistor $TR_1$. On the other hand, a direct current $I_{DC}'$, which is decided by resistor $R_{53}$, NPN transistor $TR_3$ and resistor 51, flows into NPN transistor $TR_3$.

Figure 7A:
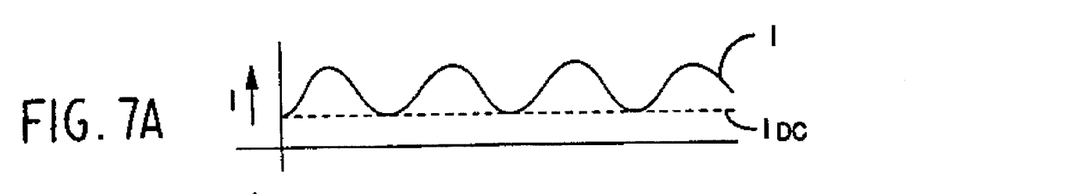
FIG. 7 shows a relationship between current I provided from the test terminal, respective currents $I_{AC}$ and $I_{AC}'$ flowing in the first current mirror circuit, and a current $I_{DC}$ flowing in the second current mirror circuit.
Figure 7B:
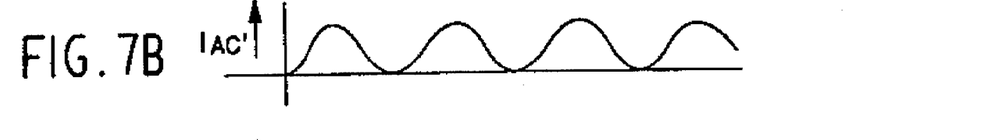
Figure 7C:
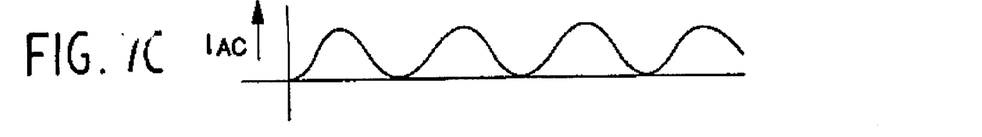

This current $I_{DC}'$ is converted into a direct current $I_{DC}$ as shown in FIG. 7(a) in the forth NPN transistor $TR_4$ which is a part of a second current mirror comprised of NPN transistor $TR_3$, $TR_4$ and resistor $R_{51}$, $R_{52}$.

A voltage signal Vin which supplies a superposed current I ($I_{AC}' + I_{DC}$) as shown in FIG. 7(a) is applied to the test terminal 31. A current $I_{AC}'$ is converted into a current $I_{AC}$ at NPN transistor $TR_2$ which is a part of the first current mirror comprised of NPN transistors $TR_1$, $TR_2$ and resistors $R_1$, $R_2$. Transistor $TR_2$ pulls a current from the current-voltage conversion amplifier 20 via the terminal 32. Rb is a pull-down resistor for bypassing noise voltage to earth in the same way as explained in the first embodiment.

The characteristics of PD is that the current is zero when PD is not exposed to a light, and the current becomes large when PD is exposed to a strength light. Accordingly, it is necessary to test the current-voltage conversion amplifier circuit in the same condition having the same current as that of actually flowing into PD when exposed the light to PD. However, it is sometimes difficult to provide waveform $I_{AC}'$ shown in FIG. 7(b) whose minimum current is 0 from the test terminal 31 to the transistor $TR_1$ in the same way. In that case, a voltage signal Vin which supplies a superposed current I ($I_{Ac}' + I_{DC}$) as shown in FIG. 7(a) is applied to the test terminal 31. Then only dc component $I_{DC}$ is removed from the current I at the second current mirror. Therefore, a current waveshape $I_{AC}'$ shown in FIG. 7(b) whose lower portion of current amplitude is 0 V can be provided to the first transistor $TR_1$.

As mentioned above, the second current mirror constituted of NPN transistors $TR_3$, $TR_4$ and resistors $R_{51}$, $R_{52}$ is a circuit for generating this dc component $I_{DC}$. The voltage divided by resistors $R_{55}$ and $R_{54}$ is applied to a collector of NPN transistor $TR_3$ via resistor $R_{53}$. The divided voltage value and the resistance values are decided so that the direct current $I_{DC}'$ flows into the collector of transistor $TR_3$. This direct current $I_{DC}'$ is converted into $I_{DC}$ via the second current mirror constituted of NPN transistors $TR_3$, $TR_4$ and resistors $R_{51}$, $R_{52}$.

According to the circuit of fifth embodiment, the lower portion of the current amplitude of current $I_{AC}$ becomes exactly 0 V as is shown in FIG. 7 (c). That is, since its current waveform can be very close to the current waveform which flows in PD when PD is exposed the light, it is possible to pull the current, having closer operation characteristics of the actual PD than in the first embodiment, from the current-voltage conversion amplifier.

As mentioned above, the current-voltage conversion amplifier having a plurality of current pouring type PDs can be tested in the fourth embodiment as well, by applying the test signal Vin to the test terminal 31 without exposing light to PDs in the same way as explained in the fourth embodiment.

Embodiment 6

Figure 8:
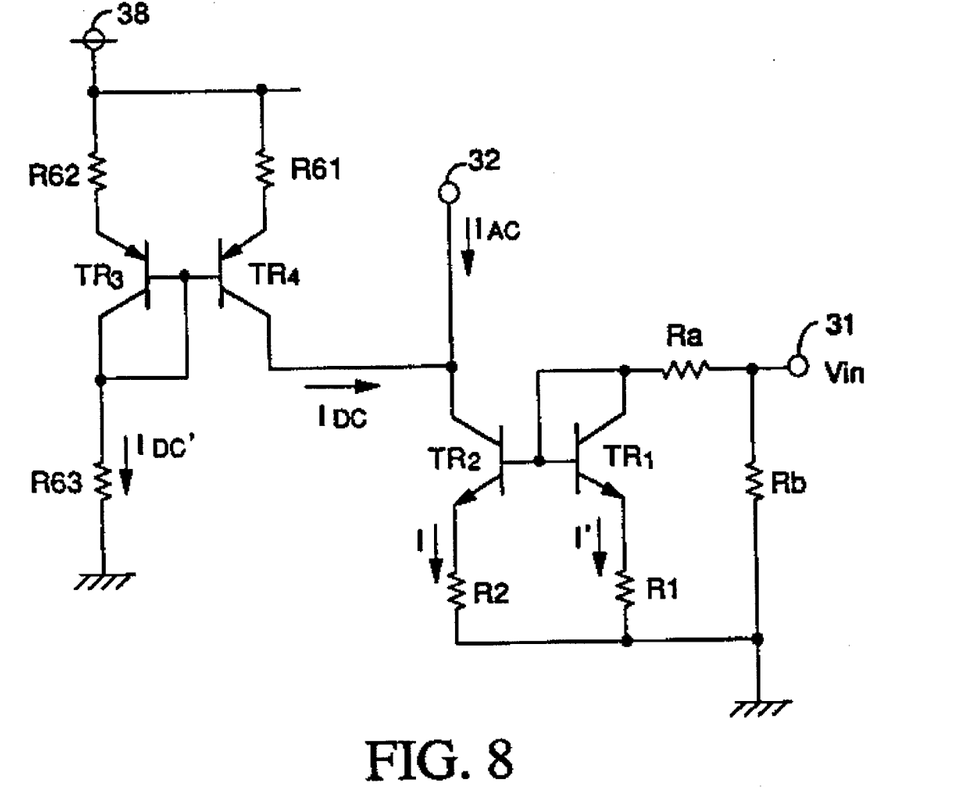
FIG. 8 illustrates a circuit testing for the current-voltage conversion amplifier of a sixth embodiment of the present invention.

FIG. 8 is a circuit diagram of a test circuit for testing the current-voltage conversion amplifier of sixth embodiment of the present invention. In FIG. 8, $TR_1$ and $TR_2$ are PNP transistors, $TR_3$ and $TR_4$ are PNP transistors, and $R_1$, $R_2$, $R_{61}$, $R_{62}$, $R_{63}$, Ra and Rb are resistors. NPN transistors $TR_1$, $TR_2$ and resistors $R_1$, $R_2$ constitute a first current mirror. PNP transistors $TR_3$, $TR_4$ and resistors $R_{61}$, $R_{62}$ constitutes a second current mirror.

FIG. 9 shows a relationship between a current I' flowing in transistor $TR_1$, a current I flowing in transistor $TR_2$, a current $I_{DC}$ flowing in the second current mirror circuit, and a current $I_{AC}$ which pulls a current from the current-voltage conversion amplifier.

An operation of the sixth embodiment is explained below. This circuit is arranged to pull the same current characteristics as that generated in PD when PD is actually exposed to the light from the current-voltage conversion amplifier, as well as the circuit of fifth embodiment. FIG. 9(b) shows a current $I_{AC}$ having similar current characteristics to the operating characteristics of PD when PD is actually exposed to light.

Figure 9A:
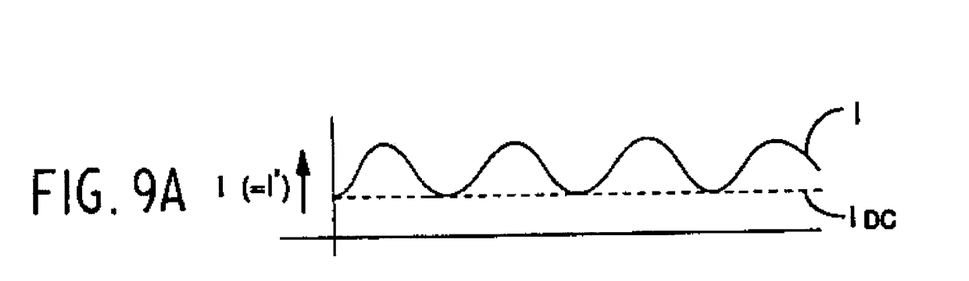
FIG. 9 shows a relationship between current I' provided from the test terminal and respective currents I and $I_{AC}$ flowing in the first and the second current mirror circuits.
Figure 9B:
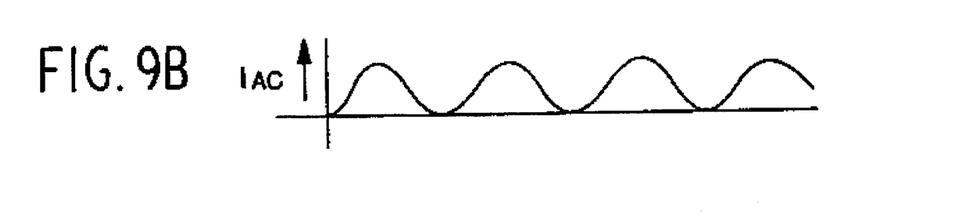

FIG. 9(a) shows a superposed current I ($=I_{AC}+I_{DC}$) which is superposed with a direct current $I_{DC}$ and an alternate current $I_{AC}$. In FIG. 8, a voltage Vin is applied to the test terminal 31 so that a current I' shown in FIG. 9(a) flows in the first NPN transistor $TR_1$. The current I' is converted into current I by the first current mirror constituted of NPN transistors $TR_1$, $TR_2$ and resistors $R_1$, $R_2$. Since this current I is superposed by the alternating current $I_{AC}$ and the direct current $I_{DC}$ as shown to FIG. 9(a), it is necessary to generate a current $I_{DC}$ which is added to the current $I_{AC}$ from outside of the first current mirror circuit. The current $I_{AC}$ having similar characteristics to the actual operating characteristics of PD pulls current from the current-voltage conversion amplifier 20 via the current terminal 32.

The second current mirror circuit constituted of PNP transistors $TR_3$, $TR_4$ and resistors $R_{61}$, $R_{62}$ generates the dc current $I_{DC}$. In the second current mirror circuit, characteristics of PNP transistor and resistance values of resistors $R_{61}$, $R_{62}$ and $R_{63}$ are decided so that it generates a necessary dc current $I_{DC}$. As described above, the direct current component $I_{DC}$ in the collector current of NPN transistor $TR_2$ is supplied from the collector of PNP transistor $TR_4$. Therefore, only the alternating current component $I_{AC}$ can be pulled from the current-voltage conversion amplifier 20 in the sixth embodiment.

According to the circuit of this sixth embodiment, since the lower portion of the current amplitude of current $I_{AC}$ becomes 0 V as shown in FIG. 9(b), it is possible to obtain a current wave shape which is very close to the operating characteristics of PD when PD is exposed to the light. Accordingly, it is possible to pull a current closer to the operation of PD from the current-voltage conversion amplifier, rather than in the first embodiment, when PD is exposed to the light.

As mentioned above, the current-voltage conversion amplifier having a plurality of current pouring type PDs can be tested in the sixth embodiment as well, by applying the test signal Vin to the test terminal 31 without exposing light to PDs in the same way as explained in the fifth embodiment.

In the above explanation, the test voltage was shown in the sine wave, but a rectangular pulse can be used as well. Also, above explanation refers to the test circuit for testing the current-voltage conversion amplifier which uses the current pulling type PD. It would be easily understood however from the second embodiment that the test circuit for testing the current-voltage conversion amplifier which uses the current pouring type PD can be realized in the same way by using PNP transistor.

Those skilled in the art will recognize that many modifications to the foregoing description can be made without departing from the spirit of the invention. The foregoing description is intended to be exemplary and in no way limiting. The scope of the invention is defined in the appended claims and equivalents thereto.

What is claimed is:

1. A test circuit for testing a current-voltage conversion amplifier, comprising:

a current mirror circuit comprised of a first NPN transistor and a second NPN transistor;

an input terminal for applying a test voltage;

a first resistor connected between said input terminal and a collector of the first NPN transistor; and a current terminal connected to a collector of the second NPN transistor, wherein said test circuit passes a current from the current-voltage conversion amplifier to said current terminal according to the test voltage which is applied to said input terminal.

2. A test circuit of claim 1, wherein said current mirror circuit comprises:

said first NPN transistor and said second NPN transistor having bases connected to each other;

a second resistor whose one end is connected to an emitter of the first NPN transistor; and a third resistor whose one end is connected to an emitter of the second NPN transistor, wherein the base of said second NPN transistor is connected to a collector of the first NPN transistor, and the other ends of said second resistor and said third resistors are connected to a ground.

3. A test circuit for testing a current-voltage conversion amplifier, comprising:

a current mirror circuit comprised of a first PNP transistor and a second PNP transistor;

an input terminal for applying a test voltage;

a first resistor connected between said input terminal and an emitter of the first PNP transistor; and a current terminal connected to an emitter of the second PNP transistor, wherein said test circuit passes a current from said current terminal to the current-voltage conversion amplifier according to the test voltage which is applied to said input terminal.

4. A test circuit of claim 3, wherein said current mirror circuit comprises:

said first PNP transistor and said second PNP transistor having bases connected to each other;

a second resistor whose one end is connected to an emitter of the first PNP transistor; and a third resistor whose one end is connected to an emitter of the second PNP transistor, wherein the base of said second PNP transistor is connected to a collector of the first PNP transistor, and the other ends of said second resistor and said third resistor are connected to a direct power supply.

5. A test circuit for testing a current-voltage conversion amplifier, comprising:

a current mirror circuit comprised of n NPN transistors;

an input terminal for applying a test voltage;

a first resistor connected between said input terminal and a collector of a first of said NPN transistors; and a plurality of current terminals connected to collectors of said n−1 NPN transistors, respectively;

wherein said test circuit passes respective currents from the plurality of current-voltage conversion amplifiers to said current terminals according to the test voltage which is applied to said input terminal.

6. A test circuit of claim 5, wherein said current mirror circuit comprises:

said n NPN transistors having bases connected to each other;

an n-th resistor whose one end is connected to an emitter of the n-th NPN transistor; and wherein the base of a second NPN transistor is connected to a collector of the first NPN transistor, and the other end of said n-th resistor is connected to ground.

7. A test circuit of claim 6, further comprising:

an another NPN transistor having a base connected to the collector of the first NPN transistor, an emitter connected to the base of the first NPN transistor, and a collector connected to a direct power supply.

8. A test circuit of claim 7, wherein:

the collector of said another NPN transistor is connected to the direct power supply via a current source.

9. A test circuit for testing a current-voltage conversion amplifier comprising:

a first current minor circuit comprising first and second NPN transistors;

a second current mirror circuit comprising third and fourth NPN transistors;

an input terminal for applying a test voltage;

a first resistor connected between the input terminal and collectors of the first and fourth NPN transistors;

a current terminal connected to a collector of the second NPN transistor; and a current supplying circuit connected to a collector of the third NPN transistor;

wherein said test circuit passes a current from the current-voltage conversion amplifier to said current terminal according to the test voltage which is applied to said input terminal.

10. A test circuit of claim 9, wherein said current supplying circuit comprises:

a second resistor and a third resistor connected in series between a direct power source and ground, and a fourth resistor connected between the connecting point of the second and third resistors and a collector of the third NPN transistor.

11. A test circuit of claim 10, wherein:

said first current mirror circuit comprises: the first NPN transistor and the second NPN transistor having bases connected to each other; a fifth resistor whose one end is connected to an emitter of the first NPN transistor; and a sixth resistor whose one end is connected to an emitter of the second NPN transistor, said base of said second NPN transistor connected to a collector of the first NPN transistor, and the other ends of said fifth resistor and said sixth resistor connected to the ground;

said second current mirror circuit comprises: said third NPN transistor and said fourth NPN transistor having bases connected to each other; a seventh resistor whose one end is connected to an emitter of the third NPN transistor; and an eighth resistor whose one end is connected to an emitter of the fourth NPN transistor, the base of said fourth NPN transistor connected to a collector of the first NPN transistor, and the other ends of said seventh resistor and said eighth resistor connected to ground.

12. A test circuit for testing a current-voltage conversion amplifier, comprising:

a first current mirror circuit comprising a first and a second NPN transistor;

a second current mirror circuit comprising a third and a fourth PNP transistor;

an input terminal for applying a test voltage;

a first resistor connected between said input terminal and a collector of the first NPN transistor;

a current terminal connected to a collector of the second NPN transistor and a collector of the fourth PNP transistor; and a second resistor connected between a collector of the third PNP transistor and ground;

wherein said test circuit passes a current from the current-voltage conversion amplifier to said current terminal according to the test voltage which is applied to said input terminal.

13. A test circuit of claim 12, wherein:

said first current mirror circuit comprises: said first NPN transistor and said second NPN transistor having bases connected to each other; a third resistor whose one end is connected to an emitter of the first NPN transistor; and a fourth resistor whose one end is connected to an emitter of the second NPN transistor, said base of said second NPN transistor connected to a collector of the first NPN transistor, and the other ends of said third and fourth resistors connected to ground; said second current mirror circuit comprises: said third PNP transistor and said fourth PNP transistor having bases connected to each other; a fifth resistor whose one end is connected to an emitter of the third PNP transistor; and a sixth resistor whose one end is connected to an emitter of the fourth PNP transistor, said base of said fourth PNP transistor connected to a collector of the third PNP transistor, and the other ends of said fifth resistor sand said sixth resistor connected to ground.

14. A test circuit of any one of claims 1 to 13, further comprising:

a resistor connected between said input terminal and ground.

* * * * *